United States Patent [19]

Garmire et al.

[11] Patent Number: 4,488,307
[45] Date of Patent: Dec. 11, 1984

[54] THREE-MIRROR ACTIVE-PASSIVE SEMICONDUCTOR LASER

[75] Inventors: Elsa M. Garmire, Manhattan Beach; Gary A. Evans, Los Angeles; Joseph W. Niesen, Anaheim, all of Calif.

[73] Assignee: The United States of America as represented by the Secretary of the Navy, Washington, D.C.

[21] Appl. No.: 385,739

[22] Filed: Jun. 7, 1982

[51] Int. Cl.³ .............................................. H01S 3/19
[52] U.S. Cl. .................................. 372/50; 350/96.11; 372/45
[58] Field of Search ....................... 372/50, 44, 45, 46, 372/97; 350/96.11

[56] References Cited

U.S. PATENT DOCUMENTS

| 3,978,426 | 8/1976 | Logan et al. | 372/50 |
| 4,054,363 | 10/1977 | Suematsu | 350/96.11 |
| 4,136,928 | 1/1979 | Logan et al. | 372/50 |
| 4,371,966 | 2/1983 | Scifres et al. | 372/45 |

OTHER PUBLICATIONS

IGA et al., "GaInAsP/InP DH Lasers and Related Fabricating Techniques for Integration", *IEEE JQE* vol. QE-15 No. 8, Aug. 1979, pp. 702-710.

Coldren et al., "Monolithic Two-Section GaInAsP-/InP Active-Optical-Resonator Devices Formed by Reactive Ion Etching," *Appl. Phys. Lett.* 38(5), Mar. 1, 1981, pp. 315-317.

Suematsu et al., "Axial-Mode Selectivities for Various Types of Integrated Twin-Guide Lasers", *IEEE JQE*, vol. QE-13, No. 8, Aug. 1977, pp. 619-622.

*Primary Examiner*—James W. Davie
*Attorney, Agent, or Firm*—Robert F. Beers; Robert W. Adams

[57] ABSTRACT

Disclosed is a GaAlAs laser diode wherein an abrupt etch step in the waveguide layer forms a third mirror. The structure is a large optical cavity double heterostructure laser having a relatively long active cavity and a relatively short passive cavity. Output is temperature and current sensitive for single mode operation, widely-spaced dual mode operation, and narrow-band multi-mode operation.

6 Claims, 4 Drawing Figures

THREE-MIRROR ACTIVE-PASSIVE SEMICONDUCTOR LASER

BACKGROUND OF THE INVENTION

The present invention pertains to the field of semiconductor lasers. Semiconductor lasers are generally heterojunction devices fabricated in multiple layers of gallium arsenide, GaAs. This rather complex multiple junction permits laser operation to occur at low current densities, thus dissipating low powers and enabling room temperature laser operation. The laser light is produced in the GaAs layer, which has the narrowest band gap, by the recombination of the electrons and holes produced by the dc current applied as an input. The wavelength of the laser light is determined by the GaAs band gap and lies between 0.89 and 0.90 micrometers. The exact wavelength is further restricted by the requirement that the length of the laser be an integral multiple of the wavelength, $\lambda/2$, of the laser light produced. In order to produce laser powers of about 200 milliwatts, the laser volume must be large so that the laser will be approximately 1000 micrometers long.

A laser that is 1000 micrometers long extends over 1000 wavelengths. Such a long laser can meet the multiple $\lambda/2$ length requirement at a large number of closely spaced wavelengths between 0.89 and 0.90 micrometers. Thus, such a laser would simultaneously produce light of many wavelengths, which could be detrimental to a high data rate communications system. Commercial lasers that can tolerate low output power have overcome this multilasing problem by making the laser short, approximately 100 micrometers, so that lasing can occur at only a single wavelength. Complex Bragg reflectors have also been used to achieve the same purpose.

The present invention provides single wavelength lasing while permitting long lasers with high power. A preferred embodiment of the invention consists of an active section, which provides the laser energy, and a passive section, which aids in restructuring the wavelength of operation. Thus, there are two cavities of different lengths. The laser can operate only at wavelengths which meet the requirement that each cavity be an integral number of half wavelengths long. By judicious choice of active and passive cavity lengths, single wavelength laser operation is achieved. The technique should make a significant contribution to the future of semiconductor laser communication systems.

In this regard, semiconductor gallium arsenide (GaAs) lasers have a number of unique characteristics that make them ideally suited for spaceborne communications systems as well as for fiber-optic ground communications. These lasers are small in size, require low voltage and low power for operation, have demonstrated long life, and can readily be modulated for use in high data rate systems. Integrated optical systems are under development which incorporate on a single gallium arsenide substrate the semiconductor laser as well as all other components required in a communications subsystem.

Previous work in the field that is relevant to the present invention includes U.S. Pat. No. 4,054,363 by Y. Suematsu for Multi-Heterostructure Wave Guide Type Optical Integrated Circuitry, Oct. 18, 1977. The patent discloses an optical integrated semiconductor laser incorporating a cavity resonator positioned adjacent to the laser diode. This patent shows structure that is somewhat similar to that presently disclosed as a preferred embodiment, but it does not contemplate the concept of combined active and passive segments of the cavity with a three-mirror configuration.

U.S. Pat. No. 3,948,583 to P. Tien for Isolation of Passive Devices and Integration with Active Devices in Optical Wave Guiding Circuits, Apr. 6, 1976, teaches the general principles of a GaAs laser diode including a cavity having both active and passive segments. The transition between active and passive areas is accomplished by a sloping transistion of the upper substrates rather than by a sharp step.

U.S. Pat. No. 4,212,020 to A. Yariv et al for Solid State Electro-Optical Device on a Semi-Insulating Substrate, July 8, 1980, illustrates a dual heterostructure laser fabricated from GaAs with a fairly sharp step in the upper structure of the integrated circuit. U.S. Pat. No. 4,136,928 to R. Logan et al for Optical Integrated Circuit Including Junction Laser with Oblique Mirror, Jan. 30, 1976, discloses a double heterostructure laser device incorporating a plurality of active regions which are separated and isolated by passive regions through a two step etching process.

U.S. Pat. No. 3,868,589 to S. Waung for Thin Film Devices and Lasers, Feb. 25, 1975, discloses an integrated optical laser in which the properties of optical elements are modified by structural properties in adjacent layers. U.S. Pat. No. 3,978,426 to R. Logan for Heterostructure Device Including Tapered Optical Couplers, Aug. 31, 1976, is of interest primarily with respect to the embodiment illustrated in FIG. 3. An active segment is created to the left of step 19 with a passive segment located to the right. The active structure has a tapered termination instead of an abrupt step. U.S. Pat. No. 4,128,815 to H. Kawaguchi et al for Single Traverse Mode Operation in Double Heterostructure Junction Laser, Dec. 5, 1978, is of general interest with respect to the concept of utilizing an optical wave guide as a controlling means for a single mode operation. U.S. Pat. No. 4,156,206 to L. Comerford et al for Grating Coupled Waveguide Apparatus, discloses a stepped base double heterostructure laser that has two etched steps such that the active layer of the laser aligns with the corrugated waveguide. The waveguide has a grating. U.S. Pat. No. 4,230,997 to R. Hartman et al for Buried Double Heterostructure Laser Device, Dec. 28, 1980, does not use the integrated optics techniques of the invention disclosure. U.S. Pat. No. 4,190,813 to R. Logan et al for Strip Buried Heterostructure Laser, Feb. 26, 1980, has opposing band gap cladding layers. The patent is not directed to the integrated optics techniques. U.S. Pat. No. 4,162,460 to S. Gonda for Optical Circuit Element, July 24, 1979, has a distributed feedback portion that is a Bragg reflector having periodically formed corrugations.

Somewhat relevant to the preferred embodiment of the present invention described herein are writings by L. Coldren et al of Bell Telephone Laboratories, and Y. Suematsu et al of Tokyo Institute of Technology in the Applied Physics Letters of Mar. 1, 1981 and the IEEE Journal of Quantum Electronics of Aug. 8, 1977, respectively. The former manuscript is entitled Monolithic Two-Section GaInAsP/InP Active-Optical Resonator Devices Formed by Reactive Ion Etching, and relates that narrow, high-aspect-ratio grooves formed by reactive ion etching are useful as partially transmissive mirrors for coupled active laser-detector, lasermodulator, and laser-etalon two-section monolithic devices, wherein experimental results emphasized control of the longitudinal mode spectrum by active etalon action. The latter manuscript is entitled Axial-Mode Selectivities for Various Types of Integrated Twin-Guide Lasers, and relates theoretical dependencies of gain to wavelength in double-resonator, distributed Bragg reflector, and two tandem-connection types of integrated twin-guide lasers, for axial-mode selectivity.

Single mode operation is not contemplated by the effort of others in the integrated optics field of double heterostructure structures. The present invention overcomes the limitations of the previous level of technology by providing for single longtitudinal mode operation.

SUMMARY OF THE INVENTION

The present invention is a method and apparatus wherein integrated optics techniques are uniquely used to fabricate a device in flat epilayers that provides sufficient longitudinal mode control to obtain single-mode operation. By selecting geometries, two modes or one group of a few modes may be obtained.

A three-mirror laser epilayer structure is described that includes a waveguide, and a passive cavity formed by the removal of layers down to and including part of the waveguide. Chemical etching and ion milling are both useful techniques that may be employed to form an etch step in the device sufficiently abrupt to cause reflection at the waveguide discontinuity. The resulting three-mirror cavity has a relatively long laser region and a relatively short passive region which together inventively form the basis of longitudinal mode control. Longitudinal-mode selection is determined by the fractional decrease in gain at the adjacent mode of the passive cavity and the fractional decrease in reflectivity of the passive cavity at the adjacent mode of the active cavity. The former requires thin passive cavities, and the latter is determined by a relationship that is dependent on the fractional decrease in waveguide height at the etch step.

Single-mode operation occurs as a result of the overlap of the resonance for the transmission of the active cavity with the peak in the reflectivity of the passive cavity and the mutual overlap of both these resonances with the peak of the gain line. The requirement that all three effects overlap puts criteria on the cavity dimensions. However, since the peak of the gain spectrum and the optical path lengths within the diode are temperature and current sensitive, it is possible to vary the device temperature and operating current to ensure that all three criteria are achieved.

The three-mirror active-passive GaAs laser has several of the same properties as lasers in external cavities, but is much more convenient since it is monolithic integration. The longitudinal mode control available with the use of three mirrors has several important applications.

DESCRIPTION OF THE PREFERRED EMBODIMENT

Figure 1:
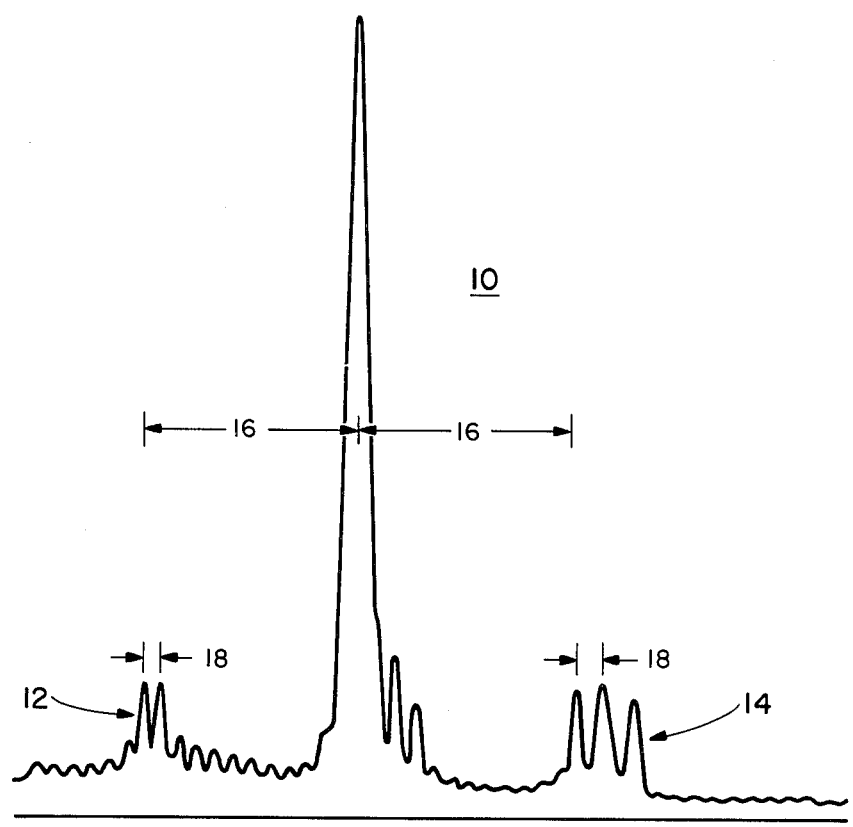
FIG. 1 is a graphical representation of single mode operation, also showing closely spaced modes of the active laser cavity and distantly spaced modes of the passive cavity.

Single mode output 10 is shown in FIG. 1. Weak sidebands 12 and 14 may be observed at spacings equal to both the spacing of the passive cavity 16 and spacing of the active cavity 18.

Single mode operation occurs as a result of the overlap of the resonance for transmission of the active cavity with the peak in the reflectivity of the passive cavity, and the mutual overlap of both these resonances with the peak of the gain line. The requirement that all three effects overlap puts criteria on the cavity dimensions. However, since the peak of the gain spectrum, and the optical path lengths within the diode are temperature and current sensitive, it is possible to vary the device temperature and operating current to ensure that all three criteria are achieved.

A wide range of geometries for the active cavity and passive cavity structures can be made to result in single mode operation. Table I shows data on several laser structures and the range of currents over which single mode operation will result. The table includes measured threshold currents in amps for stripe contacts 25 micrometers wide. High thresholds would be due to non-optimum epilayer structure and are consistent with two-mirror Fabry-Perot diodes fabricated from the same material, indicative that neither the etch step nor a short passive region contributes substantially to loss in the diode. It should be possible to obtain continuous wave operation from the example active/passive structures when the epilayer structure is optimized.

TABLE I

| | Parameters of Single Mode Lasers | | | | | |
|---|---|---|---|---|---|---|
| | Length of Passive Cavity (μm) | Length of Active Cavity (μm) | Threshold Amps | Single Mode Operation (% Above Threshold) | δR/R (%) | $(g-g_o)/g_o$ |
| 1 | 27 | 275 | 1.8 | >25 | 4 | 14 |
| 2 | 25 | 275 | 2.4 | 10 | 3 | 14 |
| 3 | 38 | 415 | 1.8 | 50 | 3 | 8 |
| 4 | 38 | 415 | 2.0 | 30 | 3 | 8 |
| 5 | 96 | 484 | 2.7 | 10 | 15 | 1.6 |
| 6 | 100 | 484 | 2.4 | 6 | 15 | 1.3 |
| 7 | 95 | 485 | 2.7 | 3 | 15 | 1.6 |
| 8 | 20 | 310 | 4.0 | MMA | 1.5 | 17 |
| 9 | 10 | 310 | 2.1 | MMA | 0.4 | 73 |

TABLE I-continued

| | | Parameters of Single Mode Lasers | | | |
|---|---|---|---|---|---|
| Length of Passive Cavity (μm) | Length of Active Cavity (μm) | Threshold Amps | Single Mode Operation (% Above Threshold) | δR/R (%) | $(g-g_o)/g_o$ |
| 10 | 200 | 470 | 2.3 | 10 | 86 | 0.3 |
| 11 | 200 | 470 | 3.7 | MMP | 86 | 0.3 |
| 12 | 200 | 470 | 3.0 | MMP | 86 | 0.3 |
| 13 | 200 | 470 | 2.8 | MMP | 86 | 0.3 |

Where MMA is multimode in the activity cavity, and MMP is multimode in the passive cavity.

Table I includes theoretical estimates for the mode-selective properties of the active/passive structure in the various geometries. Mode selection is determined by the fractional decrease in gain at the adjacent mode of the passive cavity, $(g-g_o)/g_o$, and the fractional decrease in reflectivity of the passive cavity at the adjacent mode of the active cavity, δR/R. These quantities were determined as follows.

Estimates for the decrease in gain may be obtained by fitting measured fluorescence spectra near the peak of the emission with a Gaussian model:

$$g = g_o \exp\left(-\frac{\lambda - \lambda_o}{\Delta\lambda}\right)^2.$$

Within 200 angstrom of the emission peak, the fluorescence could be fit by $\Delta\delta = 20$ angstrom, while the peak of the gain line, $\delta_o$, shifted approximately 2 angstrom/-degree Kelvin.

The estimate for δR/R introduced by the etch step may be obtained by devising a model based on an abrupt etch step in a hollow metal waveguide. For a single mode waveguide with an abrupt fractional decrease in waveguide height, ε, the reflectivity is given by $$R_2 = \left\{\frac{(2-\epsilon)^2 - 4p^2(1-\epsilon)}{(2-\epsilon)^2 + 4p^2(1-\epsilon)}\right\}^2$$

where $p = (\sin \epsilon\pi)/\epsilon\pi$. Typical numbers indicate that a 50% decrease in waveguide height at the etch step causes a reflectivity of 22%, and transmission of 78%. More accuracy in the estimate would require computer calculation of the guided mode in each region and matching boundary conditions at the etch step.

The reflectivity of the etch step can also be inferred from the ratio between the outputs from the active and passive ends. Considering the passive cavity as a typical Fabry-Perot interferometer, in which the transmission is $$T = (1 + F \sin^2\theta)^{-1}$$

where $\theta = 2\pi n L_p/\lambda$, and n is the refractive index in the waveguide, and F is the finesse of the cavity $$F = \frac{4R}{(1-R)^2}$$

in which $R = \sqrt{R_1 R_2}$, and $R_1$ is the reflectivity of the cleave, the laser will operate at maximum reflectivity for the passive cavity with $\theta = \pi/2$ and $T = (1+F)^{-1}$. Typically twice the intensity would be emitted from the active cavity as from the passive end, independent of the length of the passive cavity. Since transmission of the cleave at the active end is typically 70%, transmission of the passive cavity is typically 35%. This value for T provides $F = 1.86$, $R = 0.26$ and $R_2 = 0.22$. The result is the same as the estimated reflectivity for a 50% abrupt change in waveguide height.

Methods of fabricating single longitudinal mode GaAs lasers have typically involved distributed feedback or distributed Bragg reflector lasers, single longitudinal mode resulting from development of a single spatial mode, or coupling between active and passive waveguides. Other techniques include the use of very short lasers, bent-guide structure and use of an external cavity. Single longitudinal mode operation is provided in accordance with a preferred embodiment of the present invention at current levels up to 1.5 times threshold, by using the active-passive three-mirror arrangement shown in FIG. 2. The preferred embodiment shown utilizes an integrated optics equivalent of an external cavity, in which the use of abrupt etch step 20 between the active and passive regions introduces a third mirror into the cavity. The use of short passive cavity 22 introduces the mode control which makes possible single frequency, two-frequency, or multimode narrow band operation. The approach does not require grating fabrication, epitaxy over etched substrates, controlled diffusion or unusual electrode stripe geometries. All processing may be applied to planar, large optical cavity epitaxial material.

Passive cavity 22 is preferably formed by removing some of the epitaxial layers in this region, down through active laser layer 24, and into waveguide layer 26. Layer removal may be accomplished by ion milling and by selective chemical etching. Both techniques give comparable and reproducible results. Active laser cavity 28 would be protected by appropriate masking techniques during the reduction process. The abrupt etch step formed between the active and passive regions causes reflection from the resulting waveguide discontinuity. This mirror, mirror 30, divides the device into a laser with a long active cavity and a short passive cavity which form the origin of the mode control available with the invention. Mirrors 32 and 34 are the usual cleaves at either end of the device.

The effect of passive cavity 22 on the spectral output of the diode laser can be shown by assuming temperature is chosen to match the resonance of active cavity 28 with the peak reflectivity of the passive cavity. The fractional decrease in reflectivity of a Fabry-Perot from its peak value to that of the next mode of the active cavity can be written as $$\frac{\delta R}{R} = \frac{\sin^2\phi}{1 + F\cos^2\phi}$$

where $\phi = 2\pi n L_p(\nu_o - \nu_1)c$, with $\nu_o$ being the frequency of light at the peak reflectivity and $\nu_1$ being the frequency of the next cavity mode. Since $(\nu_o - \nu_1)/c = (2nL)^{-1}$, $\phi = \pi L_p/L_a$, where $L_a$ is the length of the passive cavity, in micrometers (μm).

From Table I it can be seen that a number of geometries result in single mode operation, substantially above threshold, even with only 2% decrease in reflectivity at adjacent modes, or 5% decrease in gain at the next mode of passive cavity 22. Indications are that the lasers are homogeneously broadened and that the addition of passive cavity 22 selects a single mode by eliminating longitudinal mode hopping or spatial hole burning. It should be pointed out that these lasers have relatively wide electrodes and operate in more than one transverse mode, yet have ranges of single frequency operation for each suitable diode.

Single mode operation necessitates two requirements. First, there must be an ability to tune the gain curve so that its peak is centered on a passive cavity resonance. Since such resonances are at most 40 angstrom apart, and the peak in the gain spectrum typically shifts two angstrom per degree, a temperature tuning of 10° C. is usually sufficient to match gain peak and passive resonance. Also to be considered is, the peak of the gain also shifts with drive current as the band fills. The optimum temperature therefore may vary somewhat with current drive. Second, there must be an ability to maintain stability of the temperature, to maintain a single mode of active cavity 28. Since the cavity modes are separated by at least two angstrom, a temperature control of ¼ of a degree should suffice to maintain the active and passive cavities in resonance. The two requirements are reasonable, and should be no impediment to maintaining single mode operation over long periods of time.

Figure 2:
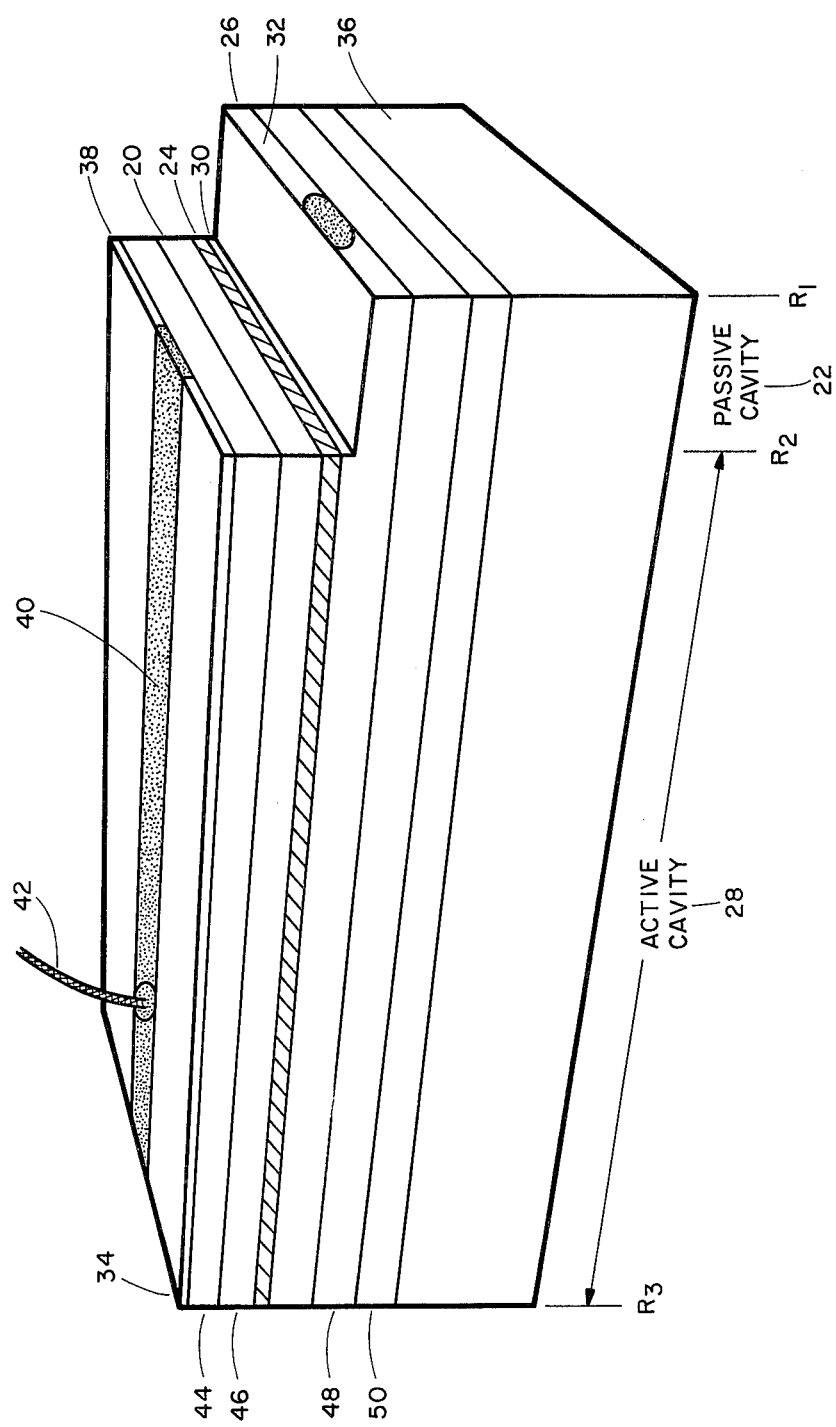
FIG. 2 is a pictorial view of the geometry of a preferred embodiment of the present invention showing active and passive laser cavity regions and the abrupt step into the waveguide layer that forms the third mirror surface.

The embodiment of FIG. 2 is offered as an example. It may be a heterostructure having GaAs substrate 36 and SiO$_2$ coating 38. Included are Au metallization stripe layer 40 for electrical contact with lead 42. Layer 40 typically would have a width of 25 μm.

The Al$_x$Ga$_{1-x}$As structure of the example has the following layers and parameters: Cap 44 is p-type material of thickness 1.6 μm and X=0; P-isolation layer 46 has thickness 4.4 μm and X=0.35, sandwiching active region 24 of thickness 0.15 μm and X=0.07, with waveguide 26 of thickness 0.9 μm and X=0.11; N-isolation layer 48 has thickness 1.9 μm and X=0.30; and, buffer 50 has thickness 4.0 μm and X=0.

Figure 3A:
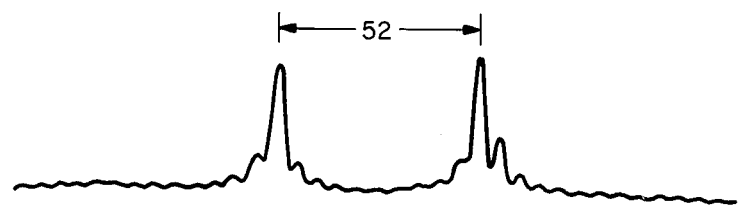
FIG. 3(A) is a graphical representation of two-frequency mode operation.

It is possible to obtain a two-frequency laser with a wide spacing between the modes, such as spacing 52 shown in FIG. 3(A), if the peak of the gain curve is exactly halfway between the two modes of the passive cavity. Such a laser may be useful for multiplexing applications. Temperature tuning the device may convert it into a single mode laser, as alluded to above.

Figure 3B:
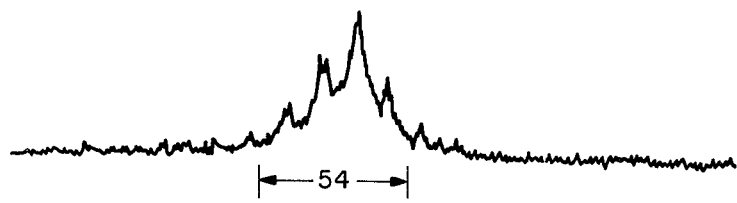
FIG. 3(B) is a graphical representation of multimode operation within a narrow frequency range, that are obtainable from structure made in accordance with the present invention, under selective control of temperature and current conditions.

In many optical fiber applications, single frequency lasers introduce considerable modal noise. The active/passive structure disclosed herein is suited to fabrication of multimode lasers of controlled bandwidth. The ratio of active to passive cavity should be more than ten to one. FIG. 3(B) shows the operation of such a laser. Spacing 54 typically would be about 10 angstrom. Passive cavity 22 serves the function of narrowing the linewidth of the laser operation below the 25 angstrom typically observed for multimode lasers. These narrower bandwidth multi-mode lasers increase the fiber optical communication bandwidth possible with multimode lasers.

Bu optimizing dimensions for active cavity 28 and passive cavity 22, optimizing the epilayer structure and varying the reflectivities of the cleaves and etch step 20, single longitudinal mode operation to at least two times threshold, and even to continuous wave operation, should be possible. In addition, the active/passive structure can produce two widely-spaced laser frequencies. Other geometries can produce narrow-band multimode oscillation, useful for fiber optics communications systems.

Obviously many modifications and variations of the present invention are possible in the light of the above teachings. It is therefore to be understood that within the scope of the appended claims, the invention may be practiced otherwise than as specifically described.

What is claimed is:

1. In a semiconductor laser, a semiconductor heterostructure, comprising:

an active laser region epilayered to a waveguide that extends beyond the longitudinal dimension of said active laser region on one end of said waveguide;

a first mirror integral to a first longitudinal end of said active laser layer and integral to a first longitudinal end of said waveguide, a second mirror integral to the opposite longitudinal end of said waveguide; and a third mirror integral to the opposite longitudinal end of said active laser layer;

wherein the longitudinal dimension between said first mirror and said third mirror defines an active laser cavity of said structure, and the portion of said waveguide that extends beyond said active laser cavity forms a passive laser cavity of said structure; and the length of said active cavity and the length of said passive cavity are each equal to an integral number of half wavelengths of the same laser frequency.

2. The structure of claim 1 wherein the length of said passive cavity is approximately one-tenth the length of said active cavity.

3. The structure of claim 1 wherein said third mirror is at an abrupt step in said structure that is substantially perpendicular to the axis of said longitudinal dimensions.

4. The structure of claim 1 wherein the gain curve of said structure is temperature dependent and the temperature of said structure is such that the peak of said curve is at a passive cavity resonance.

5. In a single longitudinal mode semiconductor laser of epilayer structure, comprising:

a semiconductor substrate having a buffer layer separating said substrate from the other layers of said epilayer structure;

a first isolation layer of a first conduction type provided on said buffer layer;

an active layer of semiconductor material having a relatively narrow band gap, provided on said isolation layer;

a second isolation layer of a second conduction type provided on said active layer;

a cap layer of said second conduction type provided on said second isolation layer; and a coating layer with electrical contact, provided on said cap layer;

wherein said second isolation layer, said cap layer, said coating layer and said active layer have a longitudinal dimension that is equal to a first integral number of half wavelengths of a laser frequency correlated to said band gap; and wherein said substrate and said first isolation layer have a longitudinal dimension greater than the longitudinal dimension of said second isolation layer, said cap layer and said coating layer and said active layer, by an amount equal to a second integral number of half wavelengths of said laser frequency.

6. The laser of claim 5 wherein said substrate is GaAs, said first isolation layer is n-type AlGaAs, said active layer is GaAs, said second isolation layer is p-type AlGaAs, said cap layer is p-type GaAs, and said coating layer is $SiO_2$.